United States Patent [19]
Park

[11] Patent Number: 6,025,641
[45] Date of Patent: Feb. 15, 2000

[54] TAPE AUTOMATED BONDING (TAB) TAPES HAVING UNDERLYING CAMBER SUPPRESSING FILMS TO INHIBIT WARPING

[75] Inventor: Bum-yeul Park, Seoul, Rep. of Korea

[73] Assignee: Samsung Electronics Co., Ltd., Rep. of Korea

[21] Appl. No.: 09/082,414

[22] Filed: May 20, 1998

[30] Foreign Application Priority Data

Dec. 3, 1997 [KR] Rep. of Korea ............... 97-65541

[51] Int. Cl.[7] ................ H01L 23/48; H01L 23/16; H05K 1/14
[52] U.S. Cl. ................ 257/668; 257/669; 257/700; 257/782; 257/783; 257/674
[58] Field of Search ................ 257/678, 666, 257/673, 676, 690, 777, 778, 783, 782, 674, 669, 671, 668, 700

[56] References Cited

U.S. PATENT DOCUMENTS

| 5,034,591 | 7/1991 | Fang ................ 219/121.69 |
| 5,137,479 | 8/1992 | Ohikata et al. ................ 439/890 |
| 5,138,438 | 8/1992 | Masayuki et al. ................ 257/686 |
| 5,288,539 | 2/1994 | Araki ................ 428/136 |
| 5,357,400 | 10/1994 | Takekawa ................ 257/712 |
| 5,365,107 | 11/1994 | Kuraishi et al. ................ 257/673 |
| 5,394,675 | 3/1995 | Yonahura ................ 29/827 |
| 5,453,913 | 9/1995 | Koyanagi ................ 361/813 |
| 5,473,190 | 12/1995 | Inoue et al. ................ 257/668 |
| 5,589,668 | 12/1996 | Yamaguchi et al. ................ 174/266 |
| 5,656,941 | 8/1997 | Bishop et al. ................ 324/754 |
| 5,729,051 | 3/1998 | Nakamura ................ 257/668 |
| 5,738,928 | 4/1998 | Kodani et al. ................ 361/751 |
| 5,804,467 | 9/1998 | Kawahara et al. ................ 438/112 |
| 5,837,154 | 11/1998 | Okabe et al. ................ 216/14 |

*Primary Examiner*—Alexander Oscar Williams
*Attorney, Agent, or Firm*—Myers Bigel Sibley & Sajovec

[57] ABSTRACT

Improved TAB tapes include an electrically insulating tape, an electrically conductive pattern on a first surface of the electrically insulating tape and a protective layer for protecting exposed portions the electrically conductive pattern. The protective layer may comprise a solder resist layer. A bonding agent is also provided for bonding the electrically conductive pattern to the electrically insulating tape. According to a preferred aspect of the present invention, any "peel-off" stress which may arise during formation of the TAB tape and/or during subsequent thermal treatment steps and cause cambering of the electrically insulating tape, may be reduced by forming a camber suppressing film on a second surface of the electrically insulating tape. The camber suppressing film is preferably made of the same material as the protective layer so that any camber stress induced by the protective layer is offset equally by an opposing camber stress induced by the camber suppressing film. Thus, TAB tapes having less susceptibility to parasitic cambering can be formed. The camber suppressing film may also be made of a material which has a thermal expansion coefficient in a range between about 0.9 and 1.1 times the thermal expansion coefficient of the protective layer.

10 Claims, 1 Drawing Sheet

TAPE AUTOMATED BONDING (TAB) TAPES HAVING UNDERLYING CAMBER SUPPRESSING FILMS TO INHIBIT WARPING

FIELD OF THE INVENTION

The present invention relates to methods of fabricating integrated circuit substrates and more particularly to methods of forming integrated circuit substrates using tape automated bonding tapes.

BACKGROUND OF THE INVENTION

The increased integration of semiconductor chips has caused conventional wire bonding methods for packaging chips to become less preferred. Instead, wireless connection methods have been pursued to improve connection reliability and efficiency. Typical wireless connection methods include flip-chip connection methods and tape automated bonding (TAB) methods which utilize TAB tapes.

Typical TAB tapes include an electrically insulating supporting layer which may comprise polyimide and an electrically conductive layer on the supporting layer. The electrically conductive layer which may comprise copper, for example, is typically deposited onto or bonded to the supporting layer using conventional sputtering and plating techniques well known to those skilled in the art. U.S. Pat. No. 5,288,539 to Araki entitled "Tab Tape With A Peeling-Prevention Structure For the Conductive Layer", discloses a TAB tape which is a composite of a supporting layer and a conductive layer. Peeling-prevention slits are also formed in the supporting layer to inhibit peel-off of the conductive layer when the TAB tape is subject to thermally-induced stresses and other bending stresses. Such peel-off may occur when the TAB tape is thermally treated (e.g., during reflow processing) because of the substantially different coefficients of thermal expansion associated with the supporting layer and conductive layer. U.S. Pat. Nos. 5,034,591 to Fang entitled "Tape Automated Bonding Leads Having A Stiffener and A Method of Bonding With Same" and 5,656,941 to Bishop et al. entitled "Tab Tape-Based Bare Chip Test and Burn-In Carrier", also disclose wireless connection methods using TAB tapes.

Referring now to FIGS. 1–2, a conventional TAB tape includes a polyimide tape 2, a copper conductive pattern 3, a solder resist layer 6 for protecting the copper conductive pattern 3 and a bonding agent 7 for bonding the copper conductive pattern 3 to the polyimide tape 2. As illustrated best by FIG. 1, the copper conductive pattern 3 provides a plurality of electrical connections to an integrated circuit chip 1 positioned within a device hole 5. A slit hole 4 is also provided to enable mounting of the TAB tape to a printed circuit board (not shown), for example. Unfortunately, as illustrated best by FIG. 2, the layers of material which make up the TAB tape may be formed at different temperatures and/or exposed to thermal treatments when bonding the conductive pattern 3 to the chip 1, for example. Thus, like the TAB tape described in the aforementioned Araki patent, the different thermal coefficients of expansion associated with the different layers of material may induce a "peel-off" stress and cause the TAB tape to become cambered in an upward direction, as illustrated by the arrows in FIG. 2. The use of a protective solder resist layer 6 may also exacerbate the degree to which the TAB tape becomes cambered. Moreover, although the above described peeling-prevention slits described in the Araki patent may inhibit peel-off, such slits may also exacerbate the degree to which the TAB tape becomes cambered and this can lead to the formation of bonding and other related defects during subsequent processing.

Thus, notwithstanding the above described techniques for using TAB tapes, there continues to be a need for TAB tapes having less susceptibility to parasitic cambering caused by exposure of the TAB tapes to thermal and other processing steps.

SUMMARY OF THE INVENTION

It is therefore an object of the present invention to provide improved TAB tapes.

It is still another object of the present invention to provide TAB tapes which are less susceptible to parasitic cambering.

These and other objects, features and advantages of the present invention are provided by TAB tapes which include an electrically insulating tape, an electrically conductive pattern on a first surface of the electrically insulating tape and a protective layer for protecting exposed portions the electrically conductive pattern. The protective layer may comprise a solder resist layer, for example. A bonding agent is also provided for bonding the electrically conductive pattern to the electrically insulating tape. According to a preferred aspect of the present invention, any "peel-off" stress which may arise during formation of the TAB tape and/or during subsequent thermal treatment steps and cause cambering of the electrically insulating tape, may be reduced by forming a camber suppressing film on a second surface of the electrically insulating tape. The camber suppressing film is preferably made of the same material as the protective layer so that any camber stress induced by the protective layer is offset equally by an opposing stress induced by the camber suppressing film. Thus, TAB tapes having less susceptibility to parasitic cambering can be formed. The camber suppressing film may also be made of a material which has a thermal expansion coefficient in a range between about 0.9 and 1.1 times the thermal expansion coefficient of the protective layer.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
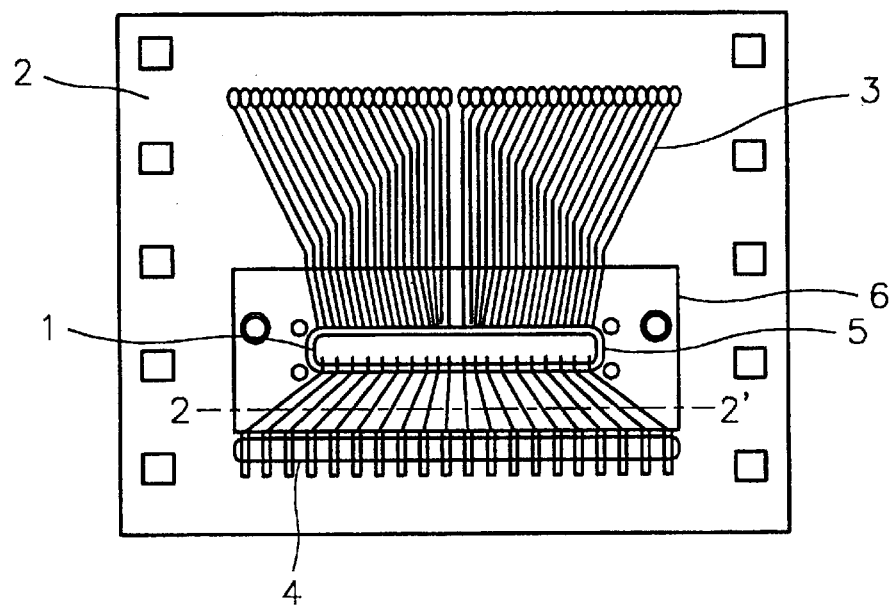
FIG. 1 is plan view of a conventional TAB tape electrically connected to an integrated circuit chip.
Figure 2:
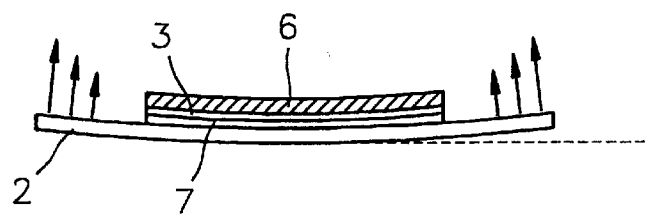
FIG. 2 is a cross-sectional view of the TAB tape of FIG. 1, taken along lines 2-2'.
Figure 3:
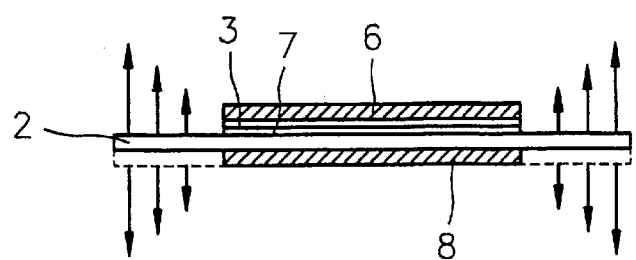
FIG. 3 is a cross-sectional view of a TAB tape according to an embodiment of the present invention.

Referring now to FIG. 3, a preferred TAB tape includes an electrically insulating tape 2 (e.g., polyimide), an electrically conductive pattern 3 (e.g., copper) on a first surface of the electrically insulating tape 2 and a protective layer 6 for protecting exposed portions the electrically conductive pattern 3. The protective layer 6 may comprise a solder resist layer, for example. A bonding agent 7 is also provided for bonding the electrically conductive pattern 3 to the electrically insulating tape 2. According to a preferred aspect of the present invention, any "peel-off" stress which may arise during formation of the TAB tape and/or during subsequent thermal treatment steps and cause cambering of the electrically insulating tape 2, may be reduced by forming a camber suppressing film 8 on a second surface of the electrically insulating tape 2, as illustrated. The camber suppressing film 8 may be patterned as a mirror-image of the protective layer 6 or may be patterned to entirely cover the second surface, as illustrated by the dotted lines. The camber suppressing film 8 may be made of the same material as the protective layer 6 so that any camber stress induced by the protective layer 6 is offset equally by an opposing stress induced by the camber suppressing film 8. Thus, TAB tapes having less susceptibility to parasitic cambering can be formed. As determined by the inventor herein, the camber suppressing film 8 is preferably made of a material which has a thermal expansion coefficient in a range between about 0.9 and 1.1 times the thermal expansion coefficient of the protective layer 6.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A tape automated bonding (TAB) tape, comprising:
    an electrically insulating tape having first and second opposing surfaces;
    an electrically conductive pattern on the first surface of said electrically insulating tape;
    a protective layer on said electrically conductive pattern, extending opposite the first surface; and
    a camber suppressing layer on the second surface of said electrically insulating tape, said camber suppressing layer comprising a material having a thermal coefficient of expansion in a range between 0.9 and 1.1 times a thermal coefficient of expansion of said protective layer.

2. The tape of claim 1, wherein said camber suppressing layer and said protective layer both comprise a solder resist material.

3. The tape of claim 1, further comprising a bonding agent between the first surface of said electrically insulating tape and said electrically conductive pattern.

4. The tape of claim 1, wherein said camber suppressing film is patterned as a mirror-image of said protective layer.

5. The tape of claim 1, wherein said camber suppressing film entirely covers the second surface of said electrically insulating tape.

6. An integrated circuit, comprising:
    an integrated circuit chip having a plurality of bond pads thereon;
    an electrically insulating tape having first and second opposing surfaces;
    an electrically conductive pattern on the first surface of said electrically insulating tape, said electrically conductive pattern having a plurality of leads which are each bonded to a respective one of said plurality of bond pads on said integrated circuit chip;
    a protective layer on said electrically conductive pattern, extending opposite the first surface; and
    a camber suppressing layer on the second surface of said electrically insulating tape, said camber suppressing layer comprising a material having a thermal coefficient of expansion in a range between 0.9 and 1.1 times a thermal coefficient of expansion of said protective layer.

7. The integrated circuit of claim 6, wherein said camber suppressing layer and said protective layer both comprise a solder resist material.

8. The integrated circuit of claim 6, further comprising a bonding agent between the first surface of said electrically insulating tape and said electrically conductive pattern.

9. The tape of claim 6, wherein said camber suppressing film is patterned as a mirror-image of said protective layer.

10. The tape of claim 6, wherein said camber suppressing film entirely covers the second surface of said electrically insulating tape.

* * * * *